United States Patent
Flynn et al.

(10) Patent No.: US 8,526,551 B2
(45) Date of Patent: Sep. 3, 2013

(54) MULTIPLE-INPUT, ON-CHIP OSCILLOSCOPE

(75) Inventors: James P. Flynn, Beaverton, OR (US); Junqi Hua, Portland, OR (US); John T. Stonick, Portland, OR (US); Daniel K. Weinlader, Allentown, PA (US); Jianping Wen, Beaverton, OR (US); Skye Wolfer, Hillsboro, OR (US); David A. Yokoyama-Martin, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 194 days.

(21) Appl. No.: 12/791,755

(22) Filed: Jun. 1, 2010

(65) Prior Publication Data

US 2011/0292990 A1     Dec. 1, 2011

(51) Int. Cl.
*H03D 1/04* (2006.01)
(52) U.S. Cl.
USPC .......................................... 375/346; 375/316
(58) Field of Classification Search
USPC ................. 375/229, 231, 232, 233, 316, 326, 375/346, 349, 350, 354, 355; 714/704; 398/209; 359/161
See application file for complete search history.

(56) References Cited

U.S. PATENT DOCUMENTS

| | | | | |
|---|---|---|---|---|
| 6,088,389 A * | 7/2000 | Larsson | ........................ | 375/231 |
| 6,115,433 A * | 9/2000 | de Lantremange | ........... | 375/326 |
| 6,678,317 B1 * | 1/2004 | Murakami et al. | ............ | 375/232 |
| 7,440,497 B2 * | 10/2008 | Balan et al. | .................... | 375/229 |
| 7,529,329 B2 * | 5/2009 | Popescu et al. | ............... | 375/354 |
| 7,545,888 B2 * | 6/2009 | Zhu et al. | ...................... | 375/326 |
| 7,574,146 B2 * | 8/2009 | Chiang et al. | ................. | 398/209 |
| 7,697,649 B2 * | 4/2010 | Okamura | ...................... | 375/355 |
| 7,746,969 B2 * | 6/2010 | Bryan et al. | .................. | 375/349 |
| 7,809,085 B2 * | 10/2010 | Rea et al. | ....................... | 375/316 |
| 8,050,318 B2 * | 11/2011 | Phanse et al. | .................. | 375/232 |
| 8,074,126 B1 * | 12/2011 | Qian et al. | ..................... | 714/704 |
| 2003/0011847 A1 * | 1/2003 | Dai et al. | ....................... | 359/161 |
| 2007/0110199 A1 * | 5/2007 | Momtaz et al. | ............... | 375/350 |
| 2009/0097541 A1 * | 4/2009 | Aziz et al. | ..................... | 375/233 |

* cited by examiner

*Primary Examiner* — Daniel Washburn
*Assistant Examiner* — Fitwi Hailegiorgis
(74) *Attorney, Agent, or Firm* — Park, Vaughan, Fleming & Dowler LLP; Steven E. Stupp

(57) ABSTRACT

An integrated circuit that includes a receive data path is described. The receive data path: equalizes a received analog signal, converts the resulting equalized analog signal to digital data values based on a clock signal, and recovers the clock signal in the digital data values. The integrated circuit also includes an on-chip oscilloscope. The oscilloscope includes: two comparators, a phase rotator that outputs an oscilloscope clock signal whose phase can be varied relative to that of the recovered clock signal, and an offset circuit that outputs a voltage offset. Based on the voltage offset and the oscilloscope clock signal, the comparators output digital values which can be used to determine eye patterns that correspond to the analog signal before and after equalization. The eye patterns can then be correlated with an error rate associated with the received data.

20 Claims, 5 Drawing Sheets

MULTIPLE-INPUT, ON-CHIP OSCILLOSCOPE

BACKGROUND

1. Technical Field

This disclosure generally relates to an integrated circuit for determining eye patterns and an error rate associated with a communication channel. More specifically, this disclosure relates to an integrated circuit that includes an on-chip oscilloscope.

2. Related Art

Oscilloscopes are widely used to debug problems in communication channels. For example, an oscilloscope can be used to determine an eye pattern associated with a receiver on a link. However, an external oscilloscope is an expensive component that can alter the signal being measured because of the perturbation that occurs when a signal path is probed. This perturbation can make it difficult to diagnose problems in a communication channel.

In principle, an on-chip oscilloscope can address this challenge, thereby allowing accurate measurements of signals (including any distortion associated with the receiver package). For example, an analog-to-digital converter (ADC) can be implemented on-chip. However, in order to obtain sufficient resolution, an on-chip ADC typically includes multiple comparators, which are expensive, and which consume valuable area on an integrated circuit.

Alternatively, in some existing receivers a single comparator or slicer in a data path is used to implement an oscilloscope. While this approach does not consume additional area on the integrated circuit, it has several drawbacks. In particular, because the comparator outputs a '0' or a '1' based on a voltage offset and a timing signal (such as a clock signal), the voltage offset and the phase of the timing signal usually need to be swept over a range of values in order to measure an eye pattern (a two-dimensional graph of voltage as a function of time during a clock period that includes information about timing and voltage margins).

However, when sweeping the voltage offset and the phase of the timing signal, the normal function of the receiver is disrupted. Furthermore, the comparator or data slicer in on-chip oscilloscopes is typically located after an equalizer. Consequently, these on-chip oscilloscope designs make it difficult to diagnose and correct problems, which can increase the development time and expense.

SUMMARY

One embodiment of the present disclosure provides an integrated circuit that includes: an input node that receives an analog signal (which can be a differential signal); an equalizer that equalizes the analog signal and outputs an equalized analog signal; a receiver circuit; and an oscilloscope circuit. The receiver circuit includes: a data slicer that converts the equalized analog signal to digital data values based on a clock signal, and a clock-data-recovery (CDR) circuit that recovers the clock signal encoded in the digital data values. The oscilloscope circuit includes a phase rotator that outputs an oscilloscope clock signal based on the clock signal recovered by the CDR. The phase rotator is capable of varying the phase of the oscilloscope clock signal with respect to the phase of the recovered clock signal. The oscilloscope circuit also includes an offset circuit that outputs a voltage offset. For example, the offset circuit may output the voltage offset based on an offset value, and the phase rotator may output the oscilloscope clock signal based on a phase value. Based on the voltage offset and the oscilloscope clock signal, a first comparator in the oscilloscope circuit outputs first digital values corresponding to the analog signal, and a second comparator outputs second digital values corresponding to the equalized analog signal.

In some embodiments, control logic in the integrated circuit provides the offset value and the phase value. For example, over multiple cycles of the clock signal, the control logic may provide a sequence of offset values and associated phase values that sweep across a range of voltages and time values, thereby determining a first eye pattern using the first digital values and a second eye pattern using the second digital values. Furthermore, the integrated circuit may facilitate simultaneous determination of an error rate associated with the digital data values, the first eye pattern and the second eye pattern.

Note that the analog signal may be associated with a predetermined data pattern, and the integrated circuit may facilitate correlating an error rate associated with the digital data values with an eye pattern that is determined using one of the first digital values or the second digital values.

In some embodiments, the oscilloscope circuit includes: a first counter that sums given digital values (which can be one of the first digital values and the second digital values), and a second counter that counts a number of cycles of the clock signal while the first counter is summing the given digital values.

Note that the analog signal may be associated with a time-varying clock frequency, and the CDR circuit may track the time-varying clock frequency. Specifically, in some high-speed serial-interface standards, the transmitter's clock frequency is varied on purpose. Embodiments of the present invention are able to correctly track this time-varying clock frequency because the oscilloscope circuit uses the recovered clock signal as its clock reference.

Another embodiment provides a communication system that includes the integrated circuit.

Another embodiment provides a method for concurrently determining an error rate and eye patterns using the integrated circuit. During this method, the analog signal is received, and is equalized to obtain the equalized analog signal. This equalized analog signal is converted to digital data values based on the clock signal, which is recovered from the digital data values. Moreover, over multiple cycles of the clock signal, the sequence of offset values and associated phase values that sweep across a range of voltages and time values are provided. Then, using the offset values and phase values, voltage offsets and oscilloscope clock signals are generated. Next, the first digital values corresponding to the analog signal are determined based on the voltage offsets and the oscilloscope clock signals, and the second digital values corresponding to the equalized analog signal are determined based on the voltage offsets and the oscilloscope clock signals. Additionally, the error rate, the first eye pattern and the second eye pattern are concurrently determined, respectively, from the digital data values, the first digital values and the second digital values.

BRIEF DESCRIPTION OF THE FIGURES

Note that like reference numerals refer to corresponding parts throughout the drawings. Moreover, multiple instances of the same type of part are designated by a common prefix separated from an instance number by a dash.

DETAILED DESCRIPTION

Embodiments of an integrated circuit, a communication system that includes the integrated circuit, and a method for concurrently determining an error rate and eye patterns using the integrated circuit are described. This integrated circuit includes a receive data path that: equalizes a received analog signal, converts the resulting equalized analog signal to digital data values based on a clock signal, and recovers the clock signal in the digital data values. Furthermore, the integrated circuit includes an on-chip oscilloscope. This oscilloscope includes: two comparators, a phase rotator that outputs an oscilloscope clock signal whose phase can be varied relative to that of the clock signal, and an offset circuit that outputs a voltage offset. Based on the voltage offset and the oscilloscope clock signal, a first one of the comparators outputs first digital values corresponding to the analog signal, and a second one of the comparators outputs second digital values corresponding to the equalized analog signal. These first and second digital values can be used to determine eye patterns and, thus, to assess the performance of the integrated circuit.

By including the on-chip oscilloscope, this integrated circuit may facilitate low-cost and accurate diagnosis of problems in a communication channel. For example, the on-chip oscilloscope may not occupy a significant amount of valuable area on the integrated circuit. In addition, the on-chip oscilloscope may facilitate concurrent measurement of eye patterns and an error rate associated with the received digital data values. Consequently, correlations between these measured results can be performed in real time while the digital data values are being received, which can be used to efficiently debug problems. Thus, the integrated circuit may facilitate faster and lower cost development.

Figure 1A:
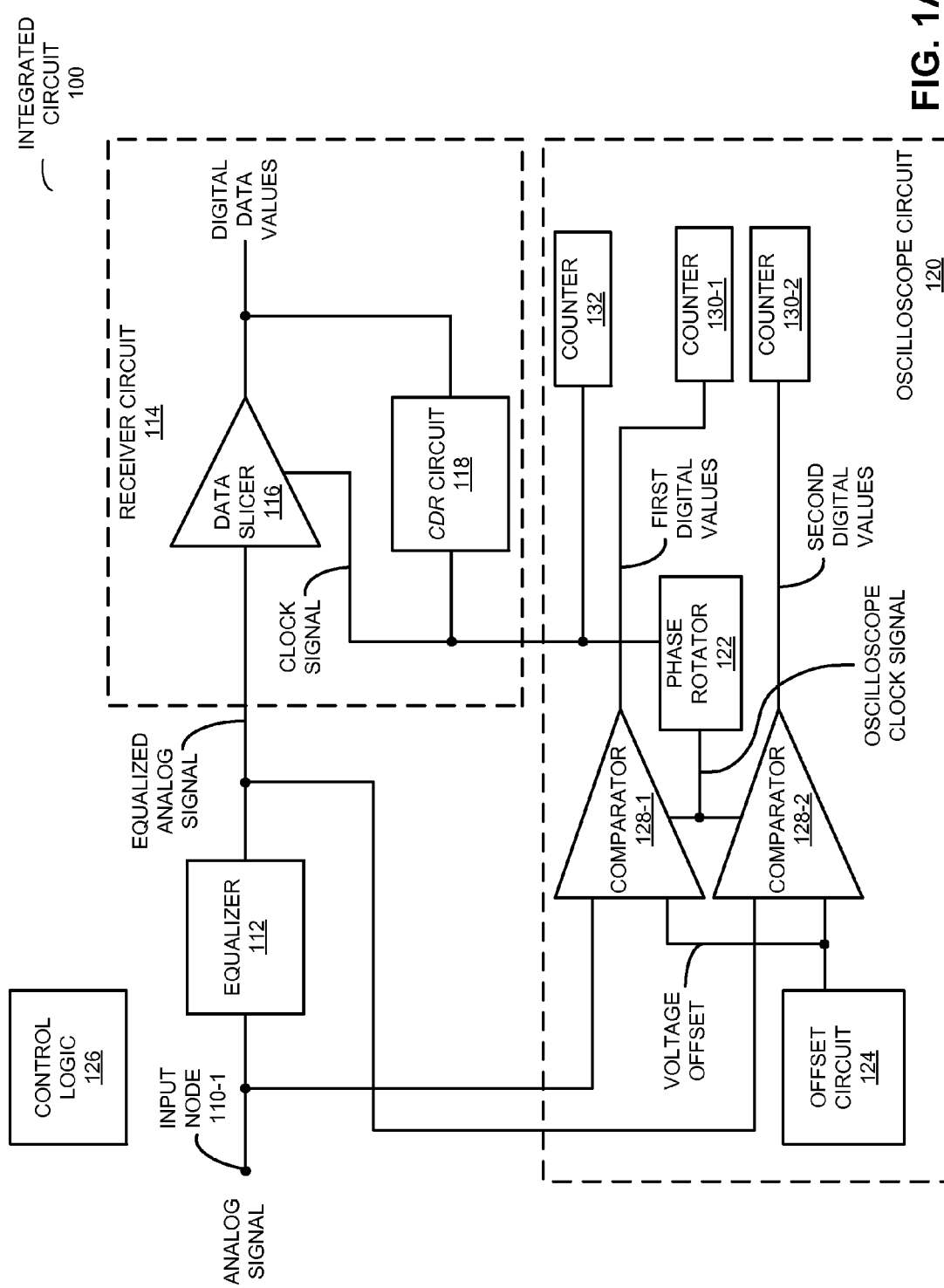
FIG. 1A is a block diagram of an integrated circuit in accordance with an embodiment of the present disclosure.

We now describe embodiments of the integrated circuit and the communication system. FIG. 1A presents a block diagram of an integrated circuit 100. This integrated circuit includes: an input node 110-1 that receives an analog signal; an equalizer 112 that equalizes the analog signal and outputs an equalized analog signal; a receiver circuit 114 and an oscilloscope circuit 120. Receiver circuit 114 includes: a data slicer 116 that converts the equalized analog signal to digital data values based on a clock signal; and a clock-data-recovery (CDR) circuit 118 that recovers the clock signal encoded in the digital data values. Oscilloscope circuit 120 includes: a phase rotator 122 (or a phase interpolator or phase mixer) that outputs an oscilloscope clock signal based on the clock signal, where the phase rotator is capable of varying the phase of the oscilloscope clock signal with respect to the phase of the clock signal (i.e., it can synchronously change the phase of the oscilloscope clock signal away from that of the recovered clock signal); and an offset circuit 124 that outputs a voltage offset. For example, the offset circuit may output the voltage offset based on an offset value (or reference voltage), and phase rotator 122 may output the oscilloscope clock signal based on a phase value. Moreover, the offset value and the phase value may be provided by control logic 126, for example, using signals or instructions (such as a command word or string).

Based on the voltage offset and the oscilloscope clock signal, comparator 128-1 in oscilloscope circuit 120 outputs first digital values corresponding to the analog signal, and comparator 128-2 outputs second digital values corresponding to the equalized analog signal. For example, if a very large (or small) value is used for the voltage offset, then the digital values output by either or both of comparators 128 may be all 0s. As the voltage offset is reduced (or increased) to a value closer to zero, more 1s may be obtained. (Ideally, at zero voltage offset, the outputs from comparators 128 are half 1s and half 0s for a balanced input data signal.) By systematically varying or sweeping the voltage offset and the phase of the oscilloscope clock signal (which gates comparators 128), comparators 128 may output digital values corresponding, respectively, to a pre-equalized (or raw) eye pattern and a post-equalized eye pattern (an illustration of an eye pattern is provided below with reference to FIG. 2). In particular, the pattern of 1s and 0s output by one of comparators 128 for a given phase value and different voltage offsets may be a cumulative distribution function. Furthermore, the change in the number of 1s and 0s as a function of the voltage offset may be a probability density function. This probability density function may represent a vertical 'slice' of the given eye pattern (with local maxima proximate to where the voltage offset equals the non-zero signal level of the analog signal or the equalized analog signal), and a series of such slices at different phase values may provide the given eye pattern (as described further in U.S. Pat. No. 7,424,380, entitled "Method and Apparatus for Integrated Distribution Function Capture," by inventors Jeffrey L. Sonntag, John T. Stonick, and Daniel K. Weinlader, issued Sep. 9, 2008, the contents of which are hereby incorporated by reference).

Thus, by providing a sequence of offset values and associated phase values that sweep across a range of voltages and time values over multiple cycles of the clock signal, control logic 126 may determine a set of first digital values that are associated with the pre-equalized eye pattern, and may simultaneously or separately determine a set of second digital values that are associated with the post-equalized eye pattern. These sets of digital values may be post-processed in hardware and/or software to determine the pre-equalized eye pattern and the post-equalized eye pattern. For example, counters 130 may sum the digital values output by comparators 128 at a given phase value and a voltage offset, such as over 64 cycles of the clock signal. Furthermore, counter 132 may count the number of cycles or periods of the clock signal while counters 130 are summing the digital values. This may ensure that a fixed total number of 0s and 1s are counted at the different phase values and voltage offsets so the eye patterns can be determined. In addition, the eye patterns may be calculated using subsequent processing in software to convert the cumulative distribution functions to probability density functions, and to aggregate the probability density functions into the desired eye patterns. In this way, an on-chip oscilloscope can be implemented in integrated circuit 100 using very little additional circuitry (and, therefore, consuming very little of the valuable area on integrated circuit 100).

In some embodiments, the analog signal is associated with a predetermined data pattern. This can enable the computation of an error rate (e.g., bit error rate) by comparing the received data pattern with the predetermined data pattern. The error rate can then be correlated with the eye pattern to identify problems in the receiver or equalization circuitry.

Figure 1B:
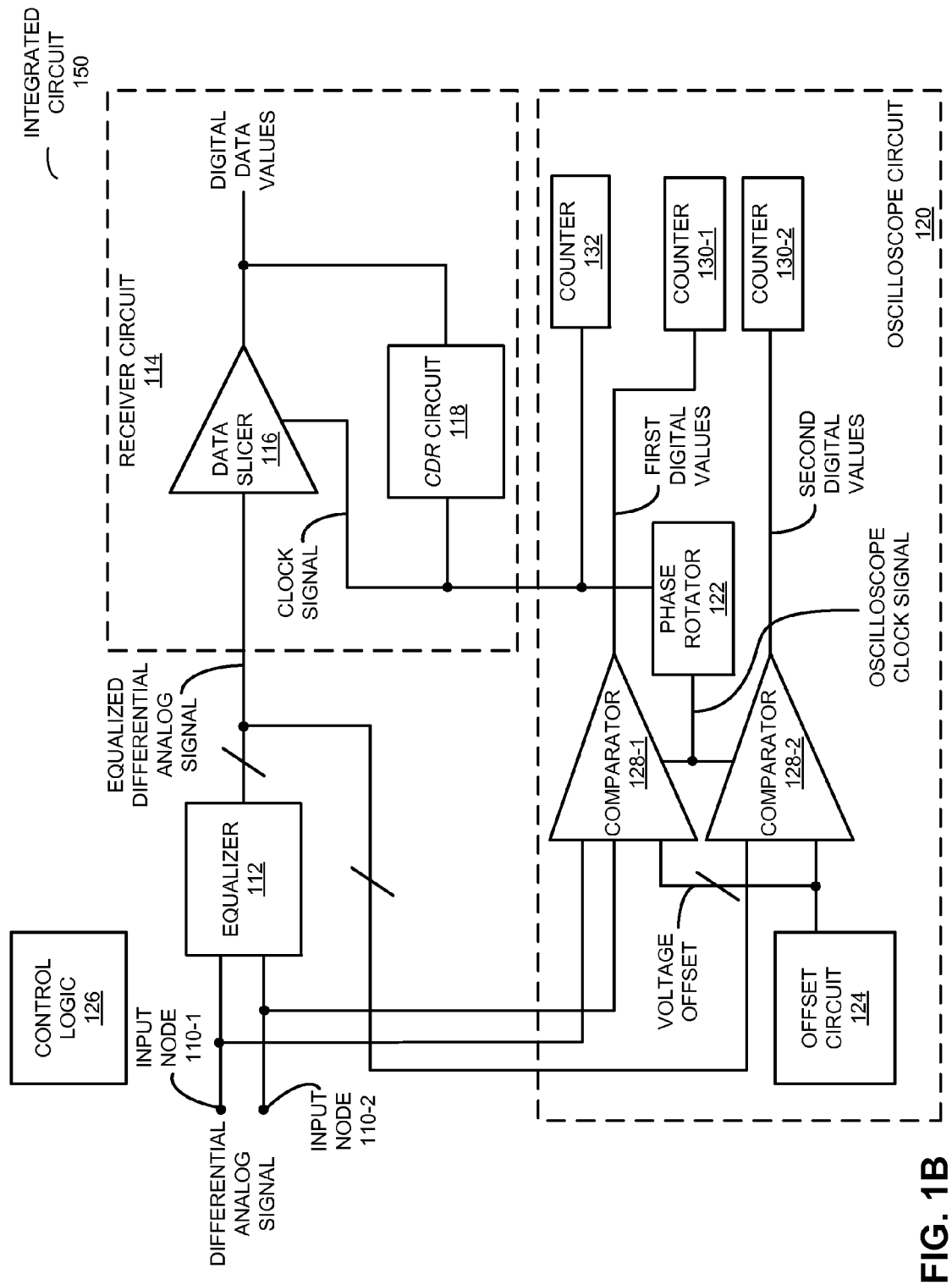
FIG. 1B is a block diagram of an integrated circuit in accordance with an embodiment of the present disclosure.

Furthermore, in some embodiments the analog signal and the inputs to the comparators are differential signals. Consequently, as shown in FIG. 1B, which presents a block diagram of an integrated circuit 150, the term "input node" refers to a differential input node which includes nodes 110-1 and 110-2 that receives the differential analog signal. Furthermore, equalizer 112, data slicer 116, and comparators 128 may each have differential inputs. Note that, unlike comparators 128, data slicer 116 may not have a voltage-offset input. Thus, the digital data values output by data slicer 116 may be based on the polarity of the equalized differential analog signal. In addition, note that the voltage offset may also be differential.

Additionally, in some embodiments the clock signal embedded in the analog signal may be intentionally varied as a function of time. For example, the fundamental frequency in the clock signal may be dithered as a function of time. Consequently, in some embodiments CDR circuit 118 and/or phase rotator 122 may track these changes so that the recovered clock signal and/or the oscilloscope signal (for a given phase value) are stationary signals.

Integrated circuits 100 (FIG. 1A) and 150 (FIG. 1B) may facilitate the simultaneous characterization of the analog signal and the equalized analog signal. This may allow direct observation of the performance of equalizer 112, and may facilitate system-level debugging.

Figure 2:
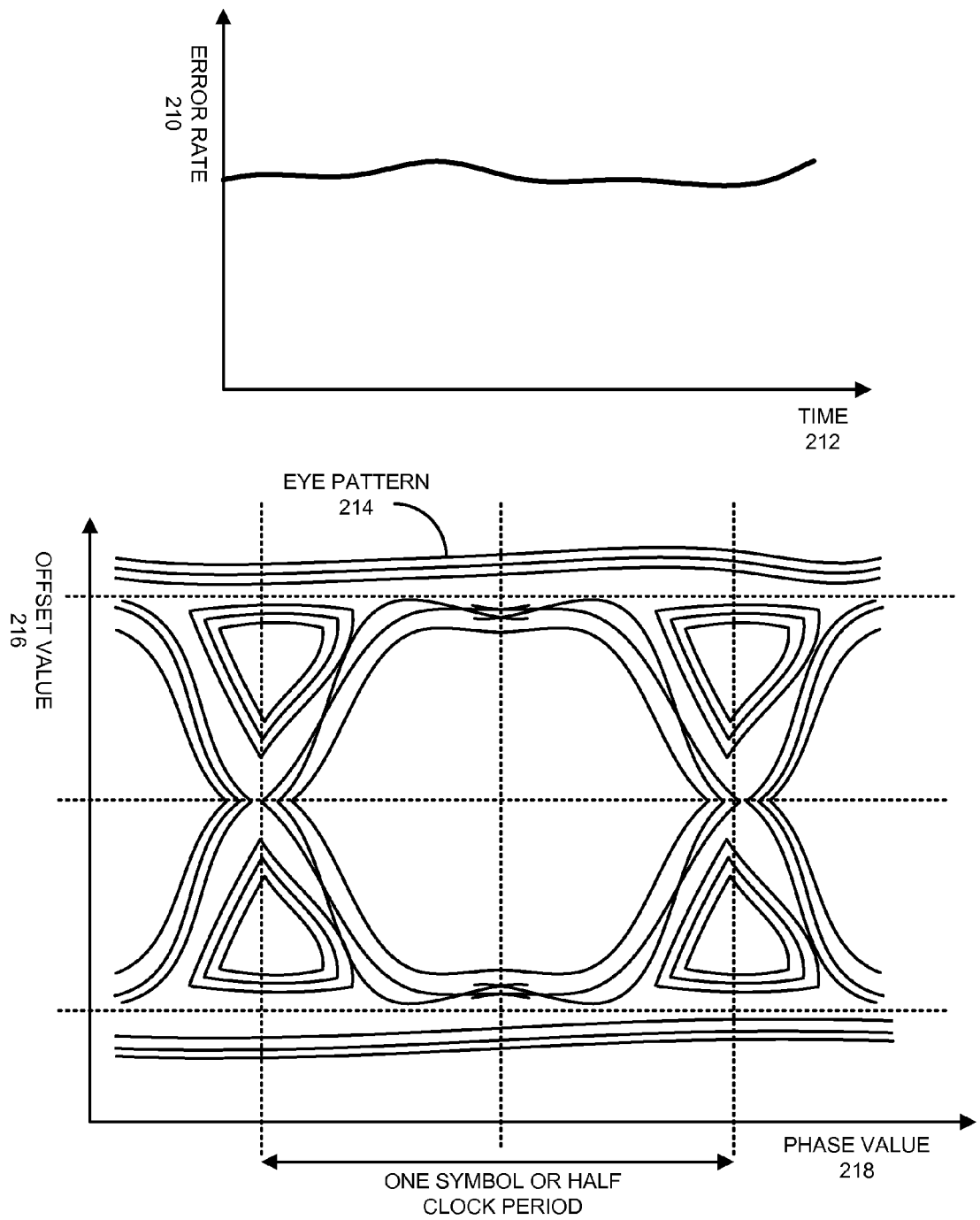
FIG. 2 is a drawing of an error rate and associated eye pattern in accordance with an embodiment of the present disclosure.

In addition, because integrated circuits 100 (FIG. 1A) and 150 (FIG. 1B) can continue to receive data (i.e., digital data values) while determining either or both eye patterns, an error rate (such as a bit error rate) can be determined simultaneously with the eye patterns. This capability allows the error rate and either or both of the eye patterns to be correlated on the fly (i.e., in real time as the analog signal is received), which may facilitate the identification of one or more error source(s). (In contrast, if the receiver circuit has to be turned off when the eye patterns are determined, the error or bug in the circuit may disappear.) This correlation is illustrated in FIG. 2, which presents a drawing of error rate 210 as a function of time 212, and associated eye pattern 214 (which is plotted as offset value 216 as a function of phase value 218). Note that, to facilitate accurate comparison of the determined error rates and eye patterns, the electrical characteristics of comparators 128 (FIGS. 1A and 1B) may match those of data slicer 116 (FIGS. 1A and 1B).

Figure 3:
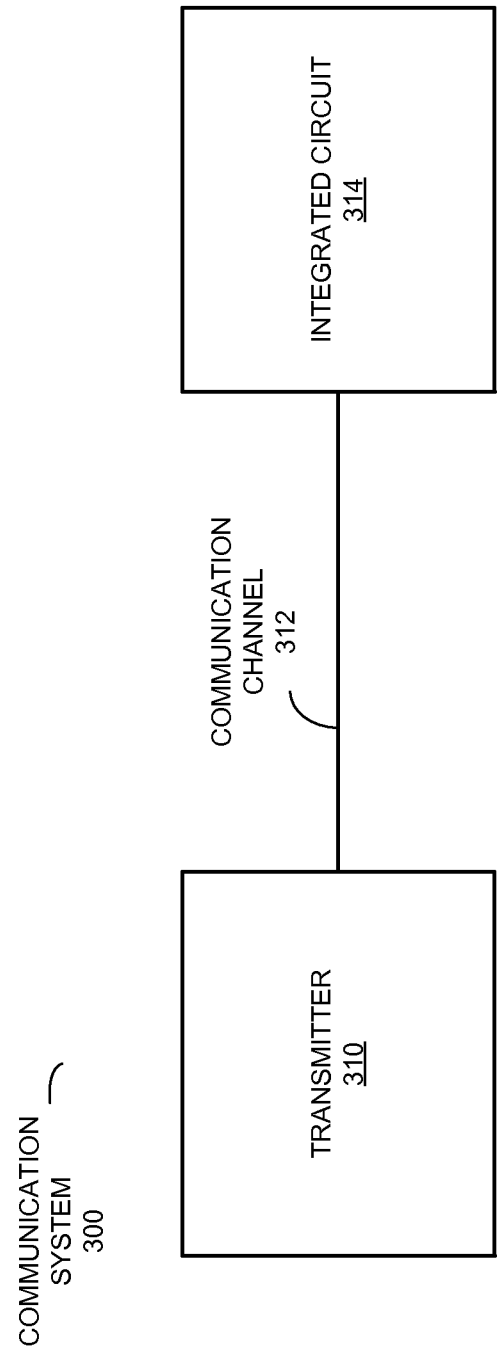
FIG. 3 is a block diagram of a communication system that includes the integrated circuit of FIG. 1A or 1B in accordance with an embodiment of the present disclosure.

FIG. 3 presents a block diagram of a communication system 300 that includes integrated circuit 100 (FIG. 1A) or 150 (FIG. 1B). In this communication system, transmitter 310 may transmit the analog signal to integrated circuit 314 via communication channel 312. For example, transmitter 310 may modulate one or more carrier signals based on digital data values.

Embodiments of the present invention can be used in asynchronous communication systems. Note that, the receiver does not receive a separate clock signal from the transmitter. The receiver recovers the clock signal from the analog signal which encodes the transmitted data. As noted previously, transmitter 310 may use a spread-spectrum clock (SSC) to generate the analog signal to reduce electromagnetic interference caused by the analog signal. Techniques that reuse the receiver's data slicer (e.g., data slicer 116) to implement the oscilloscope functionality do not operate correctly when the analog signal is generated using an SSC because these techniques are unable to track the SSC. In contrast, embodiments of the present invention can perform the oscilloscope functionality even in the presence of an SSC because embodiments of the present invention use the recovered clock from the CDR circuitry to clock the oscilloscope slicers.

Figure 4:
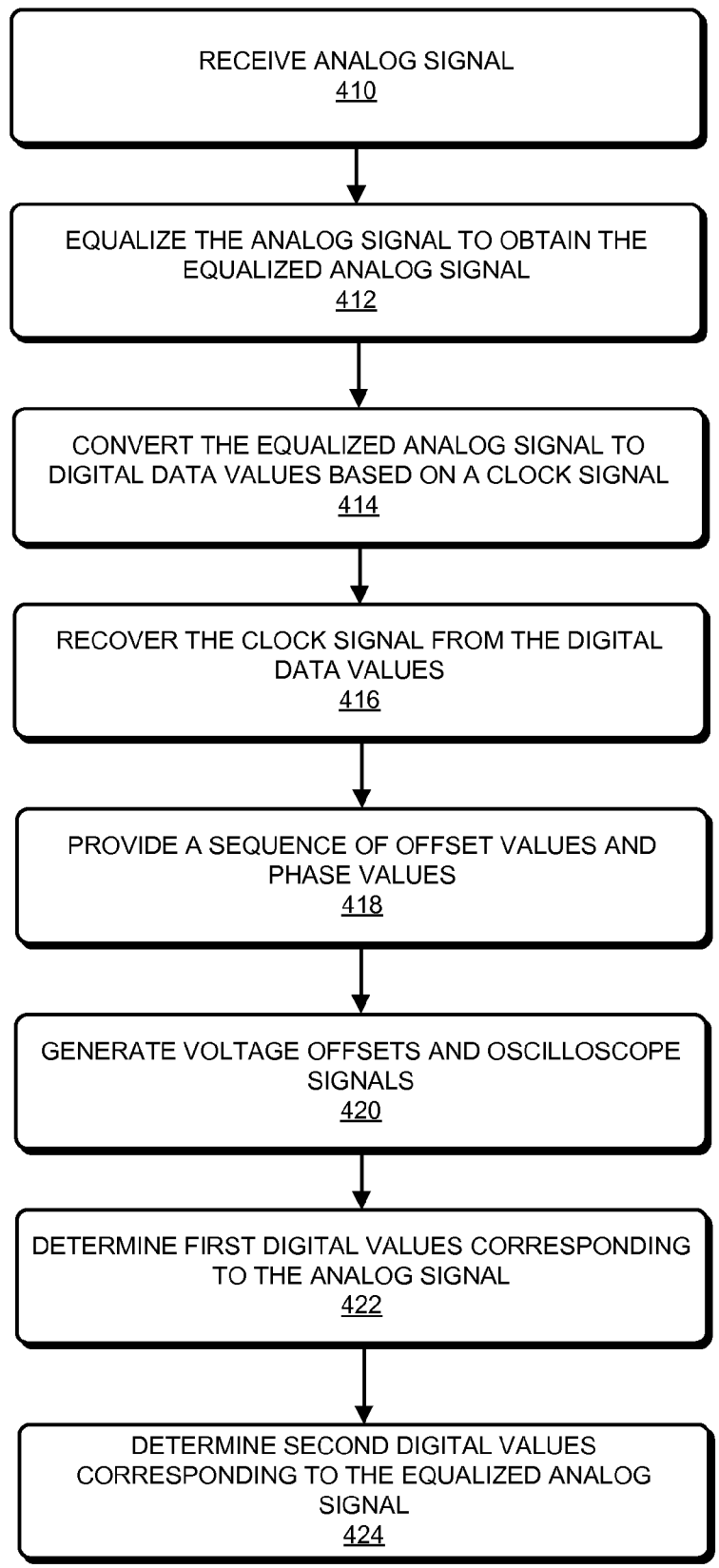
FIG. 4 is a flowchart illustrating a method for concurrently determining an error rate and eye patterns using an integrated circuit in accordance with an embodiment of the present disclosure.

We now describe embodiments of the method. FIG. 4 presents a flowchart illustrating a method 400 for concurrently determining an error rate and eye patterns using integrated circuit 100 (FIG. 1A) or 150 (FIG. 1B). During this method, the analog signal is received (operation 410), and is equalized (operation 412) to obtain the equalized analog signal. This equalized analog signal is converted to digital data values based on the clock signal (operation 414), which is recovered from the digital data values (operation 416). Moreover, over multiple cycles of the clock signal, the sequence of offset values and associated phase values that sweep across a range of voltages and time values are provided (operation 418). Then, using the offset values and phase values, voltage offsets and oscilloscope clock signals are generated (operation 420). Next, the first digital values corresponding to the analog signal are determined based on the voltage offsets and the oscilloscope clock signals (operation 422), and the second digital values corresponding to the equalized analog signal are determined based on the voltage offsets and the oscilloscope clock signals (operation 424). Additionally, the error rate, the first eye pattern and the second eye pattern can be concurrently determined, respectively, from the digital data values, the first digital values and the second digital values.

In some embodiments of method 400 there are additional or fewer operations. Moreover, the order of the operations may be changed and/or two or more operations may be combined into a single operation.

In the foregoing description and in the accompanying drawings, specific terminology and drawing symbols are set forth to provide a thorough understanding of the present embodiments. In some instances, the terminology and symbols may imply specific details that are not required to practice the embodiments. Consequently, these embodiments may include fewer components or additional components. For example, in some embodiments integrated circuit 100 (FIG. 1A) or 150 (FIG. 1B) is used for intra-chip communication, i.e., communication system 300 (FIG. 3) may be implemented on integrated circuit 100 (FIG. 1A) or 150 (FIG. 1B). Moreover, components may be combined into a single component and/or the position of one or more components may be changed.

While the preceding embodiments used communication system 300 (FIG. 3) as an illustrative example, the on-chip oscilloscope in integrated circuit 100 (FIG. 1A) or 150 (FIG. 1B) may be used in a variety of other applications.

An output of a process for designing an integrated circuit, or a portion of an integrated circuit, comprising one or more of the circuits described herein may be a computer-readable medium such as, for example, a magnetic tape or an optical or magnetic disk. This computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII) or Electronic Design Interchange Format (EDIF). These data structures can be developed from the schematics of the preceding embodiments and encoded on a computer-readable medium. Furthermore, the encoded data can be used to integrated circuits comprising one or more of the circuits described herein.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. For example, some components are shown directly connected to one another, while others are shown connected via intermediate components. In each instance the method establishes some desired electrical communication between two or more circuit nodes, or terminals. Such coupling may often be accomplished using a number of circuit configurations. Therefore, the foregoing embodiments support AC-coupled links, DC-coupled links, or both. Additionally, the discussion of the preceding embodiments is not intended to limit the present disclosure. Thus, the present disclosure is not intended to be limited to the embodiments shown, but is to be accorded the widest scope consistent with the principles and features disclosed herein. Only those claims specifically reciting "means for" or "step for" should be construed in the manner required under the sixth paragraph of 35 U.S.C. §112.

What is claimed is:

1. An integrated circuit, comprising:
    an input node configured to receive an analog signal;
    an equalizer, coupled to the input node, wherein the equalizer is configured to equalize the analog signal and to output an equalized analog signal; and
    an oscilloscope circuit that includes:
        the phase rotator coupled to a first comparator and a second comparator, wherein the phase rotator is configured to output an oscilloscope clock signal based on a clock signal, wherein the phase rotator is capable of varying the phase of the oscilloscope clock signal with respect to the phase of the clock signal;
        an offset circuit, coupled to the first comparator and the second comparator, wherein the offset circuit is configured to output a voltage offset;
        the first comparator, coupled to the input node, the offset circuit, and the phase rotator, wherein the first comparator is configured to output first digital values corresponding to the analog signal based on the voltage offset and the oscilloscope clock signal;
        the second comparator, coupled to the equalizer, the offset circuit, and the phase rotator, wherein the second comparator is configured to output second digital values corresponding to the equalized analog signal based on the voltage offset and the oscilloscope clock signal;
        a first counter, coupled to a given comparator, configured to sum given digital values, wherein the given comparator can be one of the first comparator and the second comparator, and wherein the given digital values can be one of the first digital values and the second digital values; and
        a second counter, coupled to the phase rotator, configured to count a number of cycles of the clock signal while the first counter is summing the given digital values.

2. The integrated circuit of claim 1, wherein the offset circuit is configured to output the voltage offset based on an offset value; and
    wherein the phase rotator is configured to output the oscilloscope clock signal based on a phase value.

3. The integrated circuit of claim 2, further comprising control logic, coupled to the phase rotator and the offset circuit, configured to provide the offset value and the phase value.

4. The integrated circuit of claim 3, wherein, over multiple cycles of the clock signal, the control logic is configured to provide a sequence of offset values and associated phase values that sweep across a range of voltages and time values, thereby determining a first eye pattern using the first digital values and a second eye pattern using the second digital values.

5. The integrated circuit of claim 1, wherein the analog signal is associated with a predetermined data pattern, and wherein the integrated circuit facilitates correlating an error rate associated with the digital data values with an eye pattern which is determined using one of the first digital values or the second digital values.

6. The integrated circuit of claim 1, wherein the integrated circuit further comprises a receiver circuit that includes:
    a clock-data-recovery (CDR) circuit coupled to the phase rotator, wherein the CDR circuit is configured to supply the clock signal; and
    a data slicer, coupled to the equalizer and the CDR circuit, wherein the data slicer is configured to convert the equalized analog signal to digital data values based on the clock signal supplied by the CDR circuit;
    wherein the CDR circuit is coupled to the data slicer and configured to recover the clock signal from the digital data values.

7. The integrated circuit of claim 6, wherein the analog signal is associated with a time-varying clock frequency; and
    wherein the CDR circuit is configured to track the time-varying clock frequency.

8. The integrated circuit of claim 1, wherein the analog signal is a differential analog signal.

9. A communication system, comprising an integrated circuit, wherein the integrated circuit includes:
    an input node configured to receive an analog signal;
    an equalizer, coupled to the input node, wherein the equalizer is configured to equalize the analog signal and to output an equalized analog signal; and
    an oscilloscope circuit that includes:
        the phase rotator coupled to a first comparator and a second comparator, wherein the phase rotator is configured to output an oscilloscope clock signal based on a clock signal, wherein the phase rotator is capable of varying the phase of the oscilloscope clock signal with respect to the phase of the clock signal;
        an offset circuit, coupled to the first comparator and the second comparator, wherein the offset circuit is configured to output a voltage offset;
        the first comparator, coupled to the input node, the offset circuit, and the phase rotator, wherein the first comparator is configured to output first digital values corresponding to the analog signal based on the voltage offset and the oscilloscope clock signal;
        the second comparator, coupled to the equalizer, the offset circuit, and the phase rotator, wherein the second comparator is configured to output second digital values corresponding to the equalized analog signal based on the voltage offset and the oscilloscope clock signal;
        a first counter, coupled to a given comparator, configured to sum given digital values, wherein the given comparator can be one of the first comparator and the second comparator, and wherein the given digital values can be one of the first digital values and the second digital values; and a second counter, coupled to the phase rotator, configured to count a number of cycles of the clock signal while the first counter is summing the given digital values.

10. The communication system of claim 9, wherein the offset circuit is configured to output the voltage offset based on an offset value; and wherein the phase rotator is configured to output the oscilloscope clock signal based on a phase value.

11. The communication system of claim 10, further comprising control logic, coupled to the phase rotator and the offset circuit, configured to provide the offset value and the phase value.

12. The communication system of claim 11, wherein, over multiple cycles of the clock signal, the control logic is configured to provide a sequence of offset values and associated phase values that sweep across a range of voltages and time values, thereby determining a first eye pattern using the first digital values and a second eye pattern using the second digital values.

13. The communication system of claim 12, wherein the analog signal is associated with a predetermined data pattern, and wherein the integrated circuit facilitates correlating an error rate associated with the digital data values with an eye pattern which is determined using one of the first digital values or the second digital values.

14. The communication system of claim 9, wherein the integrated circuit facilitates simultaneous determination of an error rate associated with the digital data values, a first eye pattern using the first digital values and a second eye pattern using the second digital values.

15. The communication system of claim 9, wherein the communication system further comprises a receiver circuit that includes:

a clock-data-recovery (CDR) circuit coupled to the phase rotator, wherein the CDR circuit is configured to supply the clock signal; and a data slicer, coupled to the equalizer and the CDR circuit, wherein the data slicer is configured to convert the equalized analog signal to digital data values based on the clock signal supplied by the CDR circuit;

wherein the CDR circuit is coupled to the data slicer and configured to recover the clock signal from the digital data values.

16. The communication system of claim 15, wherein the analog signal is associated with a time-varying clock frequency; and wherein the CDR circuit is configured to track the time-varying clock frequency.

17. The communication system of claim 9, wherein the analog signal includes a differential analog signal;

wherein the integrated circuit further comprises another input node configured to receive the differential analog signal in conjunction with the input node;

wherein the first comparator is coupled to the other input node and has the differential analog signal as an input;

wherein the equalizer outputs an equalized differential analog signal; and wherein the data slicer and the second comparator have the equalized differential analog signal as an input.

18. A method of concurrently determining an error rate and eye patterns using an integrated circuit, comprising:

receiving an analog signal;

equalizing the analog signal to obtain an equalized analog signal;

converting the equalized analog signal to digital data values based on a clock signal;

recovering the clock signal encoded in the digital data values;

over multiple cycles of the clock signal, providing a sequence of offset values and associated phase values that sweep across a range of voltages and time values;

generating voltage offsets from the offset values and oscilloscope clock signals, which can have different phases than the clock signal, from the phase values;

determining first digital values corresponding to the analog signal based on the voltage offsets and the oscilloscope clock signals;

determining second digital values corresponding to the equalized analog signal based on the voltage offsets and the oscilloscope clock signals; and determining, in a concurrent fashion, the error rate from the digital data values, a first eye pattern by summing the first digital values, and a second eye pattern by summing the second digital values.

19. The method of claim 18, wherein the analog signal is associated with a predetermined data pattern, and wherein the integrated circuit facilitates correlating an error rate associated with the digital data values with an eye pattern which is determined using one of the first digital values or the second digital values.

20. The method of claim 18, wherein the analog signal is a differential analog signal.

* * * * *